United States Patent

Dushkes et al.

[15] 3,670,944

[45] June 20, 1972

[54] MINIATURE ULTRASONIC BONDING DEVICE

[72] Inventors: Sherman Z. Dushkes; Rohinton J. Surty, both of Redwood City, Calif.

[73] Assignee: International Business Machines Corporation, Armonk, N.Y.

[22] Filed: Feb. 12, 1970

[21] Appl. No.: 10,964

[52] U.S. Cl. ....................228/1, 29/470.1, 310/26

[51] Int. Cl. ....................B23k 1/06, B23k 5/20

[58] Field of Search....................29/470.1; 228/1; 156/73; 310/26

[56] References Cited

UNITED STATES PATENTS

| | | | |
|---|---|---|---|
| 2,471,542 | 5/1949 | Rich | 310/26 X |
| 2,955,217 | 10/1960 | Harris | 310/26 |
| 3,007,063 | 10/1961 | Harris | 310/26 |
| 3,483,611 | 12/1969 | Balamuth et al. | 228/1 X |
| 2,891,178 | 6/1959 | Elmore | 310/26 |

*Primary Examiner*—John F. Campbell
*Assistant Examiner*—R. J. Craig
*Attorney*—Hanifin and Jancin and W. J. Madden, Jr.

[57] ABSTRACT

An ultrasonic bonding system is arranged so that the magnetostrictive transducer is situated above and at right angles to a bonding tip. The transducer is held by a mounting means and lateral straps which are affixed at the node on the body of the transducer. The mounting means is above the transducer. The bonding tip is fastened directly to the transducer without intervening driver or horn.

5 Claims, 2 Drawing Figures

PATENTED JUN 20 1972

3,670,944

*INVENTORS.*
SHERMAN Z. DUSHKES
ROHINTON J. SURTY

BY *Walter J. Madden, Jr.*
ATTORNEY

MINIATURE ULTRASONIC BONDING DEVICE

BACKGROUND OF THE INVENTION

With the increased use of miniature circuits and circuit modules, there has grown a demand for a dependable, compact bonding device for affixing wires and elements to circuit boards. As wires reach increasingly small dimensions (e.g. 0.002 inches in diameter), and are placed in increasingly dense arrangements, conventional bonding methods, such as soldering, becomy unwieldy and impractical. Soldering can cause shorts between closely adjacent bond sites because the vicosity of molten solder causes it to flow across and bridge the narrow insulative gaps between the sites. Ultrasonic bonding is a reliable alternative to soldering in that it forms dependable bonds without producing any bonding waste products (e.g. excess solder) that could clutter the circuit board. Also, soldering has a very short shelf life and requires reactivation (fluxed) for subsequent use.

Ultrasonic bonding is a well-known process; however, there exists a major barrier to the widespread use of ultrasonics in miniature circuit environments in that the inherent bulkiness and geometry of the bonding equipment are not consistent with the small sizes of the rest of the bonding environment. While ultrasonic bonders function particularly well on miniature wires and elements, the bonding equipment itself is of such construction as to limit severely the environs in which ultrasonics can be used.

The typical ultrasonic bonding arrangement consists of a bonding tip, which tip is used to vibrate the wire relative to the board. The tip is mounted at approximately a right angle to a long ultrasonic amplifying device called a horn. The amplifier or horn is about 1.6 inches long in a typical application. Attached to the horn at the end opposite to that at which the tip is attached is a relatively large half-wave length driving stub. The driving stub is of complex geometry in that mounting means must exist at a quarter wave (or nodal) point on the stub and must be attached so that it will not damp the vibrations. Attached to the furthest end of the driving stub is the ultrasonic magneto-strictive nickel stack. The direction of vibratory motion of the nickel stack is parallel to the line defined by the driving stub and amplifying horn and is perpendicular to the line defined by the bonding tip. The nickel stack, stub, and amplifying horn together are approximately 4.8 inches long in a typical application (stainless steel conical horn, 1.5:1 diameter ratio, 60 KHZ drive frequency.) The nickel stack when energized electrically, transmits oscillatory vibratory movements down the driving stub and through the amplifying horn; this movement is finally delivered to the ultrasonic bonding tip. The horn is a half wavelength long or multiples thereof. If the horn is of uniform diameter there is no amplification of transducer motion. The amplification results from the diameter ratio and taper characteristic employed. For a given material, taper, and diameter ratio there is a corresponding half wavelength at which the horn is resonant for a particular drive frequency.

The prior art bonding system then suffered from a critical disadvantage caused by its geometry. A bonding tip of approximately a half-inch in length stood perpendicular, or nearly perpendicular, to the surface of the circuit board while a long bulky combination of amplifying horn, driving stub, mounting means, and nickel stack was disposed at right angles to the bonding tip and parallel to the circuit board. This meant that the horn-stub-stack combination was merely a half-inch above the surface of the circuit board and extended out parallel to the circuit board's surface for a distance of nearly 5 inches. Bearing in mind that the main use of ultrasonic bonding is in miniature circuit applications, this 5 inch member residing close above the surface of the circuit board to which 0.002 inch (for example) diameter wires are being connected becomes incongruous. Additionally, this series coupling of the above mentioned energy transmitting elements introduces energy losses at each interface as well as internally and is thus not the optimal means of transmitting energy from transducer to tip. There are two critical interfaces — the screw lock of tip to horn and horn to driver. Any misalignment or mechanical play will dissipate energy at the interface rather than transmit it to the bonding tip — wire juncture.

The problem facing the ultrasonic bonding artisan then is how to produce ultrasonic bonding equipment which can be used to produce consistently sound bonds in the increasingly compact world of modern electronic packaging. Conventional equipment can be used with relative convenience when one is dealing with unpopulated circuit boards which are larger than 8 inches per side, or even with smaller boards if they are being worked on in open, flat environments. However, when these circuit boards become populated, problems arise. For example, a board may have components affixed thereto which are relatively tall. If components protruded vertically from the board's surface for a distance of, say, 1 or 2 inches, these components would stymie the further use of a conventional ultrasonic system. The bonding tip, being perhaps one-half inch in length, cannot reach the surface of the board because the bulky drive train (i.e. horn-stub-stack combination) which must be disposed parallel to the board's surface, cannot be lowered due to the interfering vertically protruding components.

Another impossible situation arises after a circuit board is populated and is placed in a machine environment. Modern machines are often constructed so that the populated circuit boards reside in deep cavities located in inconvenient places within the machine. If repairs or circuit alterations need be made, it is necessary to remove the board from the machine because the peculiar geometry of conventional ultrasonic bonding equipment makes it impossible to get the equipment within the cavities.

It was thought that these problems could be overcome by merely increasing the length of the bonding tip thereby allowing the drive train to be further removed from the surface of the circuit board. The bonding tip, however, has severe restrictions on its length. The tip, when energized by the amplifying horn, does not merely move back and forth in a stiff manner but rather whips and forms its own sinusoidal vibratory movement mode; that is, the tip itself has a standing wave thereon. As the length of the tip increases, its relative flexibility will increase. The bonding process, which is caused by the end point of the bonding tip vibrating a wire relative to the circuit board, will cease when a slender bonding tip reaches certain critical lengths. If a node exists at the lower extremity of the tip, the end of the bonding tip merely rests on the surface of the circuit board while its shaft whips in a sinusoidal fashion; that is, the length of the tip coupled with its flexibility destroys the ability of the ultrasonic system to transmit energy to the wire and circuit board surface. As the tip is made longer its flexibility must be decreased to insure adequate stiffness so that sufficient movement can occur at its lower extremity. The physics of ultrasonic tips requires that for a fixed resonant frequency, the diameter of the tip varies as the square of the length. Thick bonding tips are unacceptable because of wire buildup conditions. As more and more wires are placed over the surface of a board, there is reached a point where a dense wire maze is created. This maze makes it difficult to make further bonds because the bonding tip unless it is very slender, cannot penetrate to the board's surface. Because of these aforesaid factors, the length of a bonding tip is, for practical purposes, fixed and therefore the problems attendant to the inherent bulkiness of conventional bonders remain.

It is accordingly an object of this invention to provide a device capable of ultrasonically bonding elements while being suitable for use in physically constricted areas; i.e., present least interference with the wire net.

It is a more specific object of the present invention to provide a device which optimizes transmission of energy from magneto-strictive nickel stack to tip.

It is a further object of this invention to provide an ultrasonic bonding system which eliminates the need for amplifying horns. Horns generally used in fine wire bonding have gains of less than 2:1 and the loss of gain encountered by eliminating the horn can be compensated for by increasing the energy input to the magneto-strictive nickel stack from the ultrasonic power supply.

It is a further object of this invention to provide an ultrasonic bonding system which eliminates the need for complex driving stubs supported at their quarter wave points.

It is a further object of this invention to provide an ultrasonic bonding system wherein the magneto-strictive nickel stack can itself be mounted to a support member.

SUMMARY OF THE INVENTION

These and other objects are accomplished by an ultrasonic bonding arrangement wherein mounting means are affixed directly to the nodal point of the magneto-strictive nickel stack. The tip is affixed directly to the stack, preferably by brazing, to insure intimate contact. A sinusoidal wave is developed on the bonding tip and by proper selection of tip dimensions, the tip may be tuned so that an anti-node exists at its lower extremity, thus achieving amplification. The amplification attendant to the finely tuned tip is more than sufficient to produce strong bonds.

The compact mounting of the relatively heavy nickel stack is accomplished without the conventional driving stub mount. Conventional bonders are mounted in such a manner as to eliminate any physical touching of the stack other than at the point where the driving stub is attached. The reason for this is because of the observation that any touching of the stack kills or severely damps the vibration. It has been discovered, however, that a mount can be affixed directly to the stack if a rigid member is placed directly in the center of the nickel lamination array and preferably a lateral strap is positioned from the center extending to the lateral extremities of the array. This mounting means will not kill or damp the vibratory energy created by the nickel stack. The reason why the mounting member does not damp the vibrations is because there exists a node at the geometric center of the nickel stack. By assuring that the mounting member passes directly through the node, the stack can be safely mounted without the need of a separate driving stub mounting means. This means of mounting is superior to prior mounting arrangements because of its simplicity and directness.

DESCRIPTION OF THE PREFERRED EMBODIMENT

Figure 1:
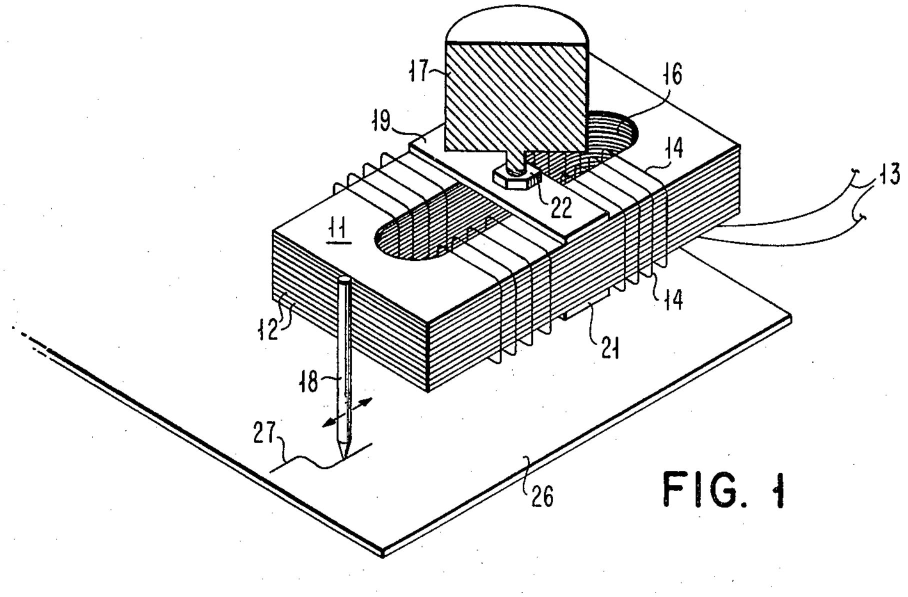
FIG. 1 is an isometric view of an ultrasonic bonder constructed in accordance with the teachings of this invention.
Figure 2:
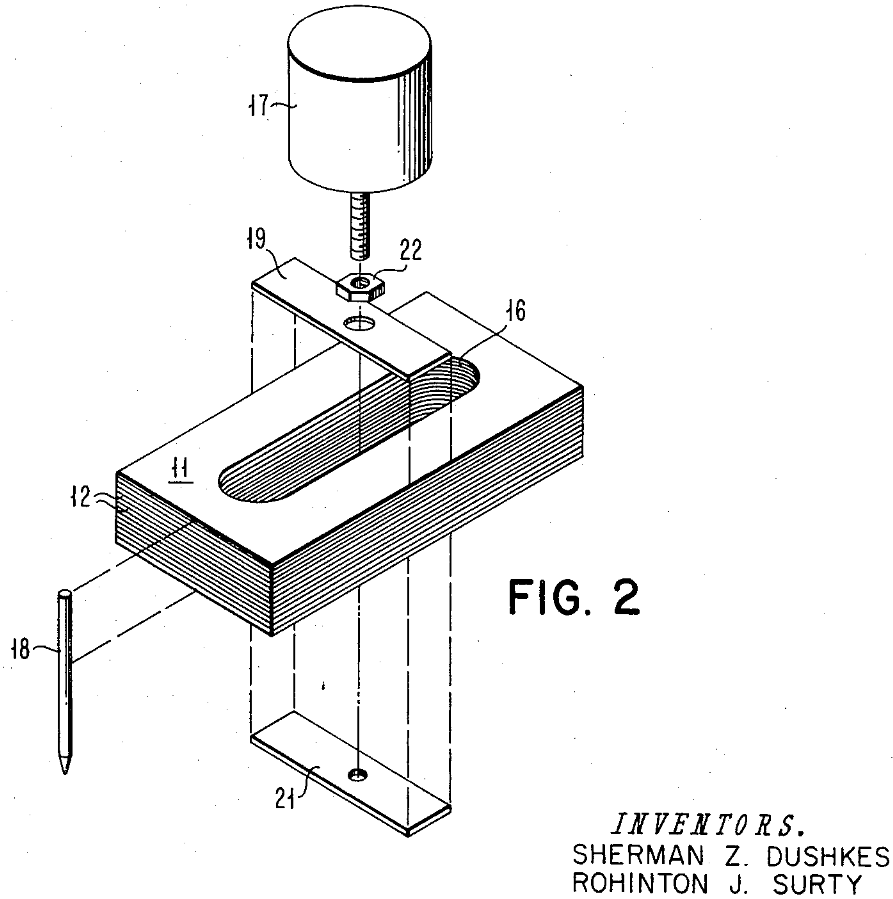
FIG. 2 is an exploded view of the structure of FIG. 1.

Referring particular to FIG. 1, magneto-strictive transducer 11 consists of nickel laminated plates 12 which vibrate in the X-direction when energized by electrical energy applied across inputs 13 to an energizing coil 14. The length of the magneto-strictive stack depends upon the material used and the drive frequency. Transducer 11 has a slot 16 along its major axis through which slot the shank of mounting means 17 is inserted. Mounting means 17 may be a solid member terminating in a small diameter threaded shank. Mounting means 17 may be held in a conventional access mechanism capable of motion along the X, Y and Z axes. Mounting means 17 carries transducer 11 and a bonding tip 18. The shank of mounting means 17 passes through a clearance hole in an upper strap 19 and threads into a tapped hole in lower strap 21. Lock nut 22 clamps the shank of mounting means 17 to transducer 11 by compressive action. Bonding tip 18 is preferably brazed to transducer 11. Bonding tip 18 may be constructed of various materials such as carbides and develops a standing wave along its length when transducer 11 is energized. The amplification of the bonding tip whip action provides more than necessary displacement to achieve strong bonds. Circuit board 26 can be of any conventional design as can wire 27. A gold-gold combination of the circuit board and wire has been found to be effective in the forming of strong bonds. Indeed, it has been found that the bonds are stronger than the copper wire itself.

The electrical energy applied across input leads 13 to coil 14 is at an ultrasonic frequency (e.g. 60 KHz). These energy-carrying wires to coil 14 pass through slot 16 in the stack.

Lateral straps 19 and 21 which are held by the shank of mounting means 17 and lock nut 22, extend from slot 16 to the outer edges of transducer 11, as is seen in FIG. 1. Straps 19, 21 additionally provide support to prevent transducer 11 from slipping into a twisting mode of vibration. Even though the width of the strap is not critical, it is recommended that it be maintained at a minimum consistent with the rigidity requirements of the device.

The bonding tip is preferably fastened to the nickel stack along its central axis which coincides with the central axis of the mounting means to avoiding twisting movements. This is not mandatory, however, as the tip may be offset to either side of the stack to meet particular spacial limitations associated with the board being bonded. The tip may be mounted at either end of the stack and in fact, tips may be mounted at both ends. This would enable bonding right up to barriers either fore or aft without turning around either bonding device or board.

While the invention has been particularly shown and described with reference to a preferred embodiment thereof, it will be understood by those skilled in the art that various changes in the form and details may be made therein without departing from the spirit and scope of the invention.

What is claimed is:

1. An ultrasonic bonding device comprising:
   ultrasonic transducer means for producing ultrasonic vibratory movement;
   means for mounting said ultrasonic transducer affixed adjacent a nodal point of the body of said ultrasonic transducer; and
   a bonding tip affixed directly to said ultrasonic transducer for transmitting ultrasonic energy from said ultrasonic transducer to the elements to be bonded.

2. A device as set forth in claim 1 wherein said mounting means includes lateral strap means affixed adjacent a nodal point on said ultrasonic transducer.

3. A device in accordance with claim 2, in which said ultrasonic transducer means is a magnetostrictive element.

4. A device according to claim 2 wherein said mounting means also includes a member terminating in a small diameter threaded shank extending through the center of the body of said transducer and secured to said lateral strap means.

5. A device in accordance with claim 3 in which said tip is affixed to said ultrasonic transducer by brazing.

* * * * *